United States Patent [19]

Bert

[11] 4,434,379

[45] Feb. 28, 1984

[54] INVERTER USING LOW-THRESHOLD-VOLTAGE FIELD-EFFECT TRANSISTORS AND A SWITCHING DIODE, FORMED AS AN INTEGRATED CIRCUIT

[75] Inventor: Georges Bert, Paris, France

[73] Assignee: Thomsonn-CSF, Paris, France

[21] Appl. No.: 244,873

[22] Filed: Mar. 18, 1981

[30] Foreign Application Priority Data

Mar. 21, 1980 [FR] France .................. 80 06402

[51] Int. Cl.³ .................. H03K 19/003; H03K 19/094; H03K 19/20
[52] U.S. Cl. ............................. 307/448; 307/571; 307/304
[58] Field of Search ............... 307/304, 315, 475, 448, 307/450, 451, 468, 469, 571

[56] References Cited

U.S. PATENT DOCUMENTS 3,299,291  1/1967  Warner, Jr. et al. ............... 307/448

Primary Examiner—John Zazworsky
Attorney, Agent, or Firm—Oblon, Fisher, Spivak, McClelland & Maier

[57] ABSTRACT

A logic inverter using field-effect transistors of the "normally off" or "quasi normally off" type with relatively wide tolerance on the threshold voltage. It comprises a first half-stage comprising a field-effect transistor with low threshold voltage, whose source, instead of being connected to ground, is connected to the gate of a second transistor placed in a second half-stage in series with a diode which plays an essential role in the switching of the inverter.

4 Claims, 3 Drawing Figures

INVERTER USING LOW-THRESHOLD-VOLTAGE FIELD-EFFECT TRANSISTORS AND A SWITCHING DIODE, FORMED AS AN INTEGRATED CIRCUIT

BACKGROUND OF THE INVENTION

1. Field of the Invention

The invention provides, as an integrated circuit, a logic inverter using field-effect transistors with a low threshold voltage as well as a switching diode.

2. Description of the Prior Art

So-called "normally on" field-effect transistors and "normally off" transistors are conventional. The first are pinched off by depletion, requiring a double-polarity supply and presenting furthermore the disadvantage of electric current consumption in the rest condition. The latter let the current pass when an appropriate voltage is applied to the control gate: they do not require a double-polarity power supply and are more economical, but on the contrary difficult to produce, because of the very small thickness of the conducting channel which gives rise to a large amount of manufacturing waste.

A third category of field-effect transistors, which is intermediate between the two preceding ones while approximating to the second one, is formed by the quasi normally off transistors: they are off for a threshold voltage $V_T$ which may be positive or negative, which means that a certain amount of dispersion is admitted in the collective manufacture of these transistors which is for example the following:

$$-0.5 \leq V_T \leq 0.2 \text{ volt}$$

This category suffers certain drawbacks. In particular:

1. In this technology, there is formed on the same integrated-circuit wafer grooved channel structures some of which form saturable loads of the logic circuits and others, after metalization of the groove, the field-effect transistors. It is difficult, because of the dispersion of the characteristics, to obtain good reproductivity of the logic circuits thus formed.

2. Because of the dispersion of the characteristics, the threshold voltage is sometimes positive, sometimes negative; in the case where it is negative, the input transistor is not pinched off, which presents, besides a drawback from the point of view of consumption, a reduction of the fan-in of the circuit preventing in particular the setting of a multiple inputs, for example in the case of the construction of gates of the "NAND" type.

SUMMARY OF THE INVENTION

The invention tends to avoid these drawbacks by making the circuit capable of operating with a conventional saturable load and a low input level coming from the presence of a large number of inputs.

The logic inverter of the invention comprises a first transistor of the substantially normally off field-effect type with a low threshold voltage whose gate forms an input terminal of the inverter, the other input terminal being ground and at least a second field-effect transistor whose gate is connected directly to the source of the first transistor and whose source and drain are respectively connected to ground and to a power supply source through at least one diode, the output terminal of the inverter being taken from the drain of the second transistor.

DESCRIPTION OF THE DRAWINGS

The invention will be better understood and other characteristics will appear from the following description and from FIGS. 1 to 3 showing three embodiments of the invention.

DESCRIPTION OF THE PREFERRED EMBODIMENTS

Figure 1:
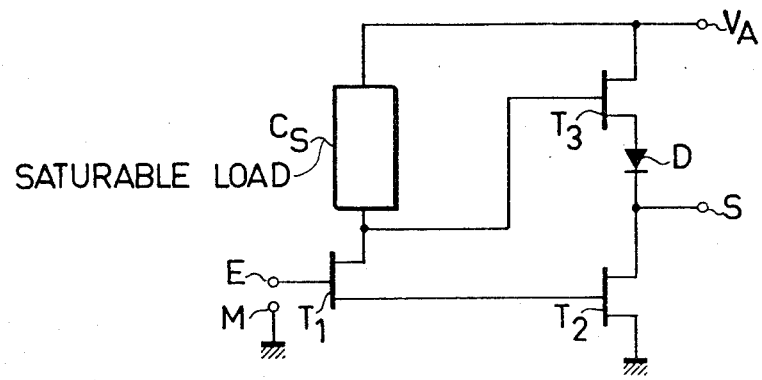

In FIG. 1 there is shown a logic inverter comprising three field-effect transistors of the above-defined low-threshold-voltage type, i.e $T_1$, $T_2$ and $T_3$. Transistor $T_1$ has its gate connected to a terminal E forming with ground M the input of the logic circuit. The source of $T_1$ is connected to the gate of transistor $T_2$ whose source is grounded.

The drain of $T_1$ is connected through a saturable load $C_S$, the nature of which will be stated hereafter, to a pole $V_A$ of a DC supply source whose other pole is grounded (source not shown).

Figure 2:
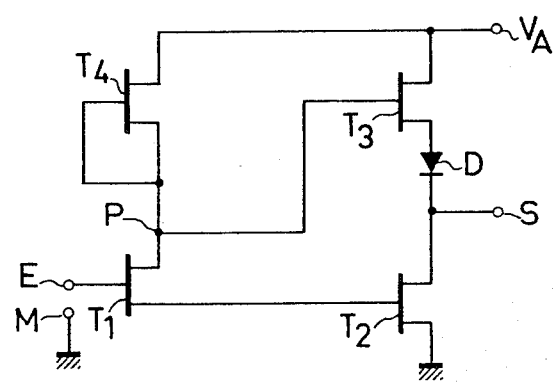

Transistor $T_3$ has its gate connected at a point P connected to the saturable load and to the drain of $T_1$. The drain of $T_3$ is connected to the pole $V_A$ and its source to the drain of $T_2$ through a diode conducting in the direction going from $V_A$ to ground, the output S of the inverter being taken from the drain of $T_2$. The saturable load $C_S$ is either a saturable resistor of the above-mentioned type, or a field-effect transistor of the normally on type whose gate and source are connected together by a short-circuit. This particular case is shown in FIG. 2 where transistor $T_4$, with a gate source short-circuit, replaces $C_S$.

The operation is the following: the junction's diode in the transistor $T_2$ introduces between ground and the gate of transistor $T_2$ a voltage which is the voltage of the Schottky diode of the gate contact, i.e. $V_{GS}$.

This voltage $V_{GS}$, even for a very small drain-source current, is of the order of 0.8 volt, so not insignificant.

The result is that a margin of 0.8 volt is available for pinching off transistor $T_1$ when the input is in logic condition "0" (low potential). In fact, in the most unfavorable case where a heavily negative threshold voltage is present for $T_1$, i.e.:

$$V_T = 0.5 \text{ volt}$$

and where the input potential of the logic inverter is extremely low, for example in the case where the transistor $T_2$ of an identical stage, preceding the inverter, is itself off, therefore where the input voltage is the residual voltage between drain and source of the pinched off transistor, i.e.:

$$V_E = V_{res}$$

the transistor $T_1$ will remain off as long as:

$$V_{res} - V_{GS} < V_T$$

$$V_{res} < V_T + V_{GS}$$

$$V_{res} < 0.3 \text{ volt}$$

This condition can be easily attained.

In the case of the circuit of FIG. 2, where the saturable resistor is replaced by a field-effect transistor $T_4$, with gate-source short-circuit, the threshold voltage of T4 must be fairly close to 0 volt, for example −0.1 volt as extreme value, otherwise the current in transistor T1 is not efficiently limited.

Figure 3:
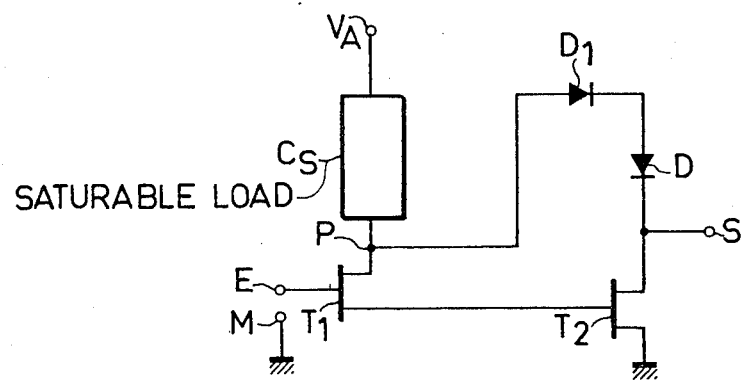

In FIG. 3 there is shown a variant of the embodiment of FIG. 1, in which transistor T3 has been replaced by a diode D1 connected between the point P and diode D. This diode is conducting in the same direction as diode D.

The operation of this circuit is very similar to that of FIG. 1.

Among the advantages of the invention not yet pointed out, the fact may be mentioned that the saturable load of the logic circuit may be formed with a field-effect transistor whose gate is connected to the source by a short-circuit, without using the ionic machining technology.

The invention applies to logic circuits using the inverter of the invention.

What is claimed is:

1. A logic inverter, formed as an integrated circuit using normally-off field effect transistors, comprising: a first transistor whose gate forms an input terminal of said inverter, and whose drain is connected to a single polarity power supply through a saturable load; and at least a second transistor whose gate is connected directly to the source of said first transistor, whose source is connected directly to the ground and whose drain forms an output terminal of said inverter, wherein the voltage $V_{GS}$ of the diode gate/source of the second transistor is sufficient to pinch off the first transistor when the input is in logic condition "0", at low potential.

2. The inverter as claimed in claim 1, wherein a first circuit branch comprises, between said power supply and ground, said saturable load, the drain and the source of the first transistor, the gate and the source of the second transistor and a second circuit branch comprises, between said power supply and ground, the drain and the source of a third field-effect transistor whose gate is connected to the drain of the first transistor, a diode having one lead connected to said source of said third transistor, and the drain and the source of said second transistor wherein said drain of said second transistor is connected to the other lead of said diode.

3. The inverter as claimed in claim 2, wherein said saturable load is a field-effect transistor whose gate is connected to the source by a short-circuit.

4. The inverter as claimed in claim 1, wherein a first branch comprises solely the first transistor by its drain and its source, and a second branch comprises the second transistor and two diodes in series between the drain of the first transistor and the drain of the second, the two diodes being conducting in the direction going from the drain of the first transistor to the drain of the second transistor.

* * * * *

UNITED STATES PATENT AND TRADEMARK OFFICE
CERTIFICATE OF CORRECTION

PATENT NO. : 4,434,379
DATED : February 28, 1984
INVENTOR(S) : Georges Bert

It is certified that error appears in the above-identified patent and that said Letters Patent is hereby corrected as shown below:

On the title page the assignee should read as follows:

--Thomson-CSF, Paris, France--

Signed and Sealed this

Tenth Day of July 1984

[SEAL]

Attest:

GERALD J. MOSSINGHOFF

Attesting Officer

Commissioner of Patents and Trademarks